(12) United States Patent
Stefani et al.

(10) Patent No.: US 11,803,394 B2
(45) Date of Patent: Oct. 31, 2023

(54) APPARATUS FOR THE PROGRAMMING OF ELECTRONIC DEVICES

(71) Applicant: SMH TECHNOLOGIES S.R.L., Villotta di Chions (IT)

(72) Inventors: Claudio Stefani, Villotta di Chions (IT); Ivan Rinaldi, Villotta di Chions (IT)

( * ) Notice: Subject to any disclaimer, the term of this patent is extended or adjusted under 35 U.S.C. 154(b) by 37 days.

(21) Appl. No.: 17/596,307

(22) PCT Filed: Jul. 1, 2019

(86) PCT No.: PCT/IB2019/055570
§ 371 (c)(1),
(2) Date: Dec. 7, 2021

(87) PCT Pub. No.: WO2020/250017
PCT Pub. Date: Dec. 17, 2020

(65) Prior Publication Data
US 2022/0222085 A1    Jul. 14, 2022

(30) Foreign Application Priority Data
Jun. 11, 2019  (EP) .................................... 19179474

(51) Int. Cl.
*G06F 9/445* (2018.01)
(52) U.S. Cl.
CPC .................................... *G06F 9/445* (2013.01)
(58) Field of Classification Search
None
See application file for complete search history.

(56) References Cited

U.S. PATENT DOCUMENTS

| | | | | |
|---|---|---|---|---|
| 6,326,806 B1 * | 12/2001 | Fallside | .............. | G06F 15/7867 326/38 |
| 9,372,956 B1 * | 6/2016 | Fan | ........................ | G06F 30/398 |
| 2002/0156998 A1 * | 10/2002 | Casselman | .......... | G06F 9/30181 712/E9.035 |

(Continued)

FOREIGN PATENT DOCUMENTS

| IT | UD20 100 119 A1 | 12/2011 |
|---|---|---|
| WO | 2006/086596 A1 | 8/2006 |

OTHER PUBLICATIONS

ISR: European Patent Office; Feb. 11, 2020.

*Primary Examiner* — Ryan D. Coyer
(74) *Attorney, Agent, or Firm* — Patshegen IP; Moshe Pinchas

(57) ABSTRACT

An apparatus (10; 14; 16; 18) for programming an electronic device (12), in particular for ISP, ICP or PP programming, comprises electronic processing means (20; 45) suitable for processing and managing at least a programming algorithm of said electronic device (12); programming means (11) connected to said processing means (20; 45) and to said electronic device (12) for receiving from said processing means (20; 45) the programming data and for sending them to said electronic device (12) through a predetermined communication protocol; interface means (25) associated with said processing means (20; 45) and with said electronic device (12); and non-volatile electronic storage means (23; 22) adapted to exchange data with said electronic processing means (20; 45) by means of at least one bidirectional data communication line (32, 31).

7 Claims, 4 Drawing Sheets

(56) References Cited

U.S. PATENT DOCUMENTS

| | | | | |
|---|---|---|---|---|
| 2003/0107399 A1* | 6/2003 | Bailis | ............... | G06F 15/7867 |
| | | | | 326/38 |
| 2010/0064024 A1* | 3/2010 | Horr | ............... | H04N 21/4586 |
| | | | | 709/217 |
| 2011/0260318 A1* | 10/2011 | Eisenstadt | ............... | H01L 24/14 |
| | | | | 257/E23.06 |
| 2019/0250941 A1* | 8/2019 | Rooke | ............... | G06F 9/5072 |

* cited by examiner

APPARATUS FOR THE PROGRAMMING OF ELECTRONIC DEVICES

FIELD OF APPLICATION

The present invention relates to an apparatus for programming of electronic devices and to the relevant programming method.

In particular, the apparatus according to the present invention can be used for ICP (In Circuit Programming), ISP (In System Programming) or PP (Pre Programming) type programming of electronic devices, such as for example microcontrollers, microprocessors, non-volatile memories, flash memories, serial memories or other memories, which can be already assembled (ICP, ISP) on an electronic device, such as, but not limited to, a cellular phone, an electronic control unit, a digital camera, or unassembled (PP), to which the following description will explicitly refer without thereby losing generality.

BACKGROUND ART

Programming apparatuses are known which are used, for example, but not only, in the prototyping phase or in a final production phase for the ICP, ISP or PP programming, by downloading an application program or a predetermined set of data on a microcontroller, a microprocessor and/or a non-volatile electronic memory already assembled on a printed circuit or an electronic device or not yet assembled.

Such known programming apparatuses comprise at least one processing unit or CPU (Central Processing Unit), usually a microprocessor or a microcontroller, which is designed for processing and managing the electronic device programming algorithm based on its specific type or family. In fact, the first processing unit is in turn programmed with a specific code specifically designed for programming a predetermined type of device, for example a specific family of microprocessors or non-volatile memories. Therefore, this programming algorithm is implemented based on the specific hardware architecture of the electronic device to be programmed, such as for example the specific internal structure of the memory address space, in the case in which the devices to be programmed are microcontrollers, microprocessors or memories, or the addresses of its devices, such as serial ports, I2C ports, ADC ports, counters or hardware or other "timers", in the event that the devices to be programmed are microcontrollers or microprocessors.

The programming apparatuses also comprise at least one field programmable device or FPD (Field Programmable Device), such as an FPGA (Field Programmable Gate Array) device, connected on one side to the processing unit and on the other to at least one programming port, for ISP, ICP or PP programming, which can be selectively connected to an electronic board or to the electronic apparatus and, therefore, to the electronic devices to be programmed.

By way of example but not limited thereto, there is the possibility of using a processing unit, in a single electronic component, composed of a microprocessor unit or Hard Processor System (HPS) unit and a programmable unit or FPD unit (FPGA). This allows to limit the necessary space on the printed circuit of the programming system and to have very fast and efficient communication channels available between the two component units.

The FPGA part of the processing unit is arranged to receive from the HPS part of the processing unit the programming data of the electronic device, for example sequentially in blocks, and to send them, based on a predetermined ICP, ISP or PP communication protocol, through the programming ports, to the electronic device to be programmed. Therefore, the FPGA part of the processing unit is specifically programmed to manage said communication protocol and the related data flow and control signals.

Such programming apparatuses also provide for connection to an electronic processor, provided with a suitable user interface, for selecting and transferring to the apparatus itself one or more files relating to the program or to the programming data of the electronic device to be programmed. This connection is normally carried out via a data communication line, such as a RS232 type serial line, a parallel line, a USB line, an ETHERNET line or other, connected to the processing unit.

A drawback of the known apparatuses for programming is that, in the case where a high programming speed is required, it is necessary to provide a communication line between the programming system and the device to be programmed of limited length and with well-sized electrical features. This may also entail the need to modify the features of the communication line based on the device to be programmed and the board on which this device is mounted. This entails high costs and long integration times of the programming system.

Another drawback of the known apparatuses for programming is that, in the case in which it is necessary to download a large quantity of configuration data inside the device to be programmed, it is necessary to provide a non-volatile storage capacity of the programming system which is in line with such amount of data. In fact, the absence of non-volatile storage capacity may entail the need to exchange large amounts of data between the electronic processor and the programming system, thus causing an increase in programming times.

OBJECTS OF THE INVENTION

Therefore, the object of the present invention is to overcome the remarkable limits of the apparatuses of the known art highlighted above.

In particular, an object of the present invention is to have an architecture of the overall programming system that is able to support different communication possibilities between the processing units and the interface block. This allows the programming system to be easily integrated and adapted to the production environment and to the changing operating conditions.

Another object of the present invention is to increase the transmission speed of the data that are sent from the processing unit to the interface block and of the data that are sent from the interface block to the processing unit. This results in a decrease in device programming times.

A further object of the present invention is to protect the integrity of the data sent from the processing unit to the interface block and of the data that are sent from the interface block to the processing unit. This translates into greater robustness of the programming system.

A further object of the present invention is to allow the storage of large amounts of data within the programming system to allow a faster and more effective access to the data to be downloaded to the device to be programmed.

The structural and functional features of the present invention and its advantages over the known art will become even more apparent by examining the following description, made with reference to the appended figures which show some preferred, but not limiting, embodiments of an apparatus for programming of electronic devices, wherein.

DETAILED DESCRIPTION OF SOME PREFERRED

Embodiments

Figure 1:
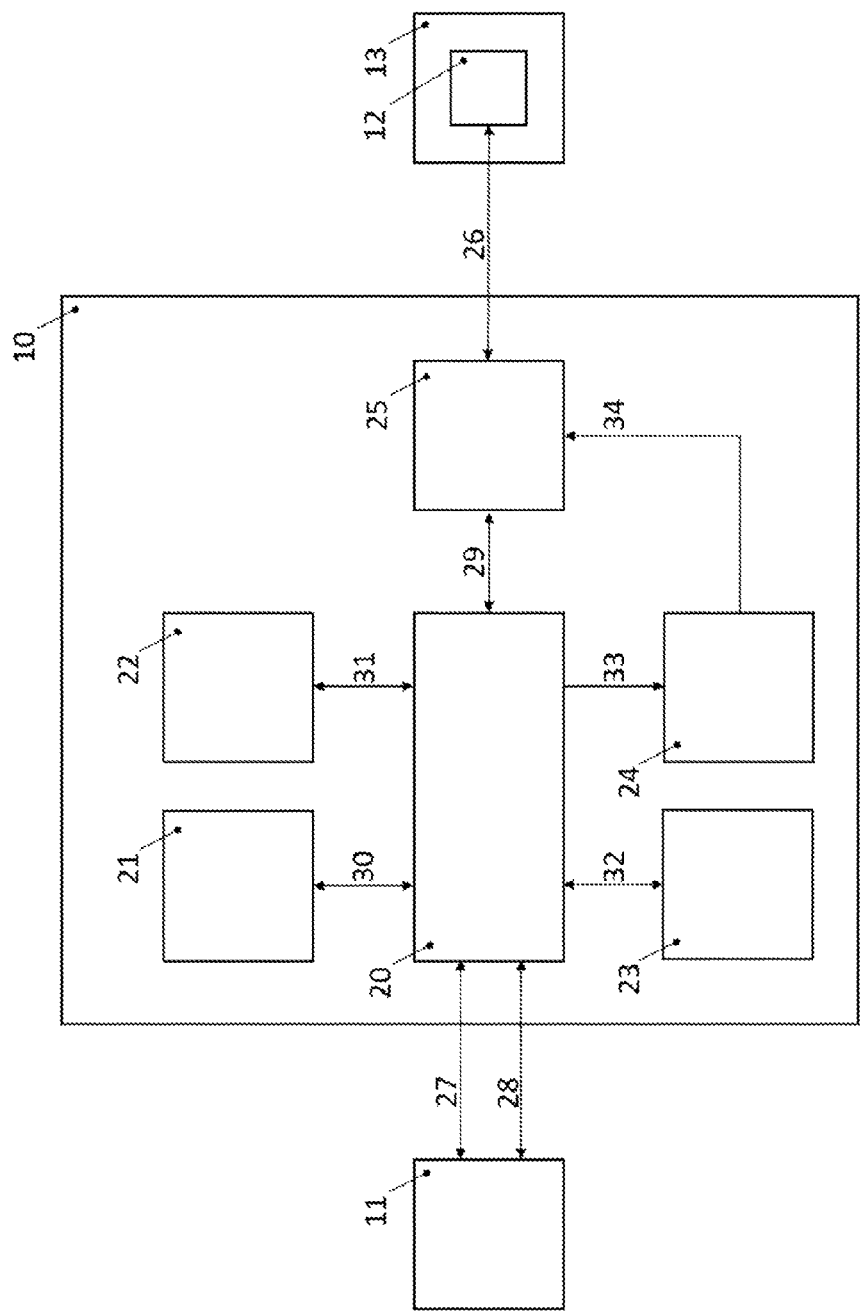
FIG. 1 is a block diagram schematically representing the implementation in which the device to be programmed is connected to the programming system via bidirectional single-ended lines.

In accordance with the aforementioned objects, an apparatus for programming electronic devices, in particular for ISP, ICP or PP programming, comprises an HPS processing unit prepared for processing and managing one or more programming algorithms of the corresponding electronic devices to be programmed.

The apparatus for programming according to the invention further comprises a programmable field unit or FPD, such as an FPGA unit, connected to the HPS processing unit or forming part of the processing unit itself and operatively associable to at least one electronic device to be programmed. Said FPGA unit is arranged to receive from the HPS processing unit the programming data processed to send them, based on a predetermined communication protocol, to the electronic device to be programmed.

The apparatus further comprises at least one interface block, associated with the relative programming interface of said processing unit, for the connection of an electronic device to be programmed.

According to an aspect of the present invention, the field programmable unit or FPD, in particular a programmable FPGA unit, is provided with a plurality of logical ports which are selectively programmed and/or programmable in a dynamic manner to manage said one or more algorithms for ICP, ISP or PP programming through said output interfaces, depending on the specific electronic devices to be programmed.

Therefore, the use of an FPD unit, in particular of an FPGA unit, which is programmed, according to the needs, to function as a predetermined processing unit for the management of at least a specific programming algorithm, allows to maintain the same electrical circuit as the programming board to perform, at different times, the programming of electronic devices, even totally different from each other.

According to a variant of the present invention, the programming apparatus further comprises an auxiliary processing unit, associated with the programmable type unit, or FPD unit, arranged to load on it predetermined configuration data. This configuration data relates at least to the desired programming of the logical ports of the FPD unit and to the one or more programming algorithms.

According to a further aspect of the present invention, each output interface is connected to said auxiliary processing unit to be selectively programmed by it according to specific operating parameters dependent on the electronic device.

It falls within the spirit of the present invention to provide that the programming apparatus comprises a reading unit, connected to the processing unit, to which non-volatile electronic storage means can be selectively associated, in which said configuration data are stored. Therefore, by associating, that is by selectively inserting the storage means, such as an SD flash memory card or micro-SD, in the reading unit, it is possible to configure, possibly also at each power-on, the programming apparatus with the data of desired configuration to allow the programming of specific electronic devices.

According to a further variant, the programming apparatus comprises volatile electronic storage means, connected to the processing unit for the temporary storage of said configuration data.

According to a further variant, the programming apparatus comprises non-volatile electronic storage means with large storage capacity and the possibility of accessing it for reading and writing at high speed, connected to the processing unit, in particular to the FPGA part, for storing of said configuration data.

According to a further variant, the programming apparatus comprises at least one input interface, associated with the processing unit, for connection with an electronic processor to receive from it at least the data relating to the one or more programming algorithms and the programming data for the electronic device to be programmed.

In this way, it is possible to select dynamically, for example by means of a user interface of the electronic processor, a predetermined file relating to the program of the electronic device to be programmed, the specific programming algorithm and the related programming interface.

According to a variant of the present invention, each programming interface on the processing unit, in particular the FPGA part, can be connected directly, by means of bidirectional single-ended lines, to the relevant interface block, when the latter operates in the proximity of the programmable unit. By way of non-limiting example, when the interface block is on the same printed circuit as the programmable unit or FPD unit.

According to a variant of the present invention each programming interface on the programmable type unit or FPD unit can be connected, after having suitably converted the bidirectional single-ended lines into bidirectional differential lines, with a connection cable to a secondary external unit. This secondary unit consists of a block converting the bidirectional differential lines into bidirectional single-ended lines and the relative interface block which is connected to the device to be programmed.

By way of non-limiting example, the connection cable is composed of bidirectional differential data lines, from lines that carry one or more supply voltages and ground lines.

According to a variant of the present invention, each programming interface on the programmable type unit or FPD unit can be in the form of at least one high-speed bidirectional differential serial line connected to the secondary external unit. By way of non-limiting example, this is allowed by particular types of programmable units or FPD units that integrate high-speed serialization and de-serialization systems that interface with high-speed bidirectional differential lines. By way of non-limiting example, the connection cable with the secondary external unit is composed of at least one bidirectional differential high-speed serial data line, by lines carrying one or more supply voltages and by ground lines. The secondary unit is composed of a block for converting high-speed bidirectional differential serial lines into bidirectional single-ended lines and the relative interface block that is connected to the device to be programmed.

According to a variant of the present invention, each programming interface on the programmable type unit or FPD unit can be connected via a parallel bus composed of single-ended bidirectional lines to a high-speed serialization and de-serialization unit. By way of non-limiting example, the high-speed serialization and de-serialization unit may consist of a further programmable unit or FPD unit which integrates high-speed serialization and de-serialization systems which allow connection to a secondary external unit via high-speed bidirectional differential serial lines. By way of non-limiting example, the connection cable with the secondary external unit is composed of at least one bidirectional differential high-speed serial data line, by lines carrying one or more supply voltages and by ground lines. The secondary unit is composed of a block for converting high-speed bidirectional differential serial line into bidirectional single-ended lines and the relative interface block that is connected to the device to be programmed.

The present invention also covers a programming method for electronic devices, in particular for programming ICP, ISP or PP type microprocessors, microcontrollers, serial memories, flash memory or others.

The process according to the present invention comprises a programming step in which, by means of a processing unit, at least one predetermined programming algorithm relating to the programming data of the specific electronic device to be programmed is processed and managed. In this phase the programming data, processed by said algorithm, are sent to the FPGA programmable part of the processing unit, operatively associated with the electronic device to be programmed. The programming data are transmitted by said FPGA unit, by means of one of the output interfaces associated with it, to the relative electronic device based on a predetermined and specific communication protocol, depending on the type of device to be programmed.

According to an aspect of the present invention, the programming method comprises an initialization step in which the processing unit, in particular the FPGA part, is selectively programmed in the field so that at least part of its logical ports are configured to emulate the operation of a desired and specific microcontroller or microprocessor arranged for the management and processing of said programming algorithm.

According to a variant of the present invention, at least said configuration data are unloaded in said initialization step by non-volatile electronic storage means, operatively connected to the processing unit.

According to a further variant, said configuration data are read by a reading unit connected to the processing unit and to which non-volatile electronic storage means are selectively associated, in which said configuration data are stored.

Now going into specific detail, with reference to the attached FIGS. 1, 2, 3 and 4, an apparatus 10 according to the present invention can be used to program electronic devices, in particular for programming In System Programming (ISP), In Circuit Programming (ICP) or Pre Programming (PP), of at least one electronic device 12, such as microcontrollers, microprocessors, serial flash memories, or others, which can be programmed directly assembled, in the case of ISP and ICP, on a circuit or an electronic board 13 of an electronic apparatus, such as a cellular telephone, an electronic control unit, a camera or a digital camera, or other, or, in the PP case, not assembled.

The apparatus in question is advantageously, but not exclusively, usable during the prototyping phases of a new apparatus, so as to allow any reprogramming of the application code in the devices to be programmed.

The implementation shown in FIG. 1 will be described below. Of the other implementation shown in FIGS. 2, 3 and 4 the differences with respect to the previous ones will be described.

The apparatus 10 comprises a processing unit 20, a programmable type unit 25, or auxiliary unit, a first volatile electronic memory 21, a second non-volatile electronic memory 22, a third non-volatile electronic memory 23 and at least one interface block 25.

The processing unit 20 integrates a processor part (HPS) and an FPD part (FPGA). The FPD part (FPGA) of the unit 20 is a programmable field unit whose logical ports are selectively programmable, in a dynamic manner, as will be better described below, so as to emulate a specific CPU (Central Processing Unit) by means of which it is possible to manage a specific algorithm of the programming data relating to the specific electronic device 12 to be programmed each time.

The processing unit 20 is connected to different components of the apparatus 10 as described below:

by means of the bidirectional data bus 30 to the first electronic memory 21, which can be for example a SRAM (Static Random Access Memory) or a SDRAM (Synchronous Dynamic Random Access Memory) with fast access for the temporary storage of programming or specific data user parameters that are used during programming;

by means of the bidirectional data bus 31 to the second electronic memory 22, which can be for example a fast-access eMMC (Embedded MultiMedia Card) for the non-volatile storage of programming data or of specific user parameters that are used during programming;

by means of the bidirectional data bus 32 to the third electronic memory 23, which can be for example an SD or a micro-SD for the non-volatile storage of configuration data for the programmable unit FPD, of programming data or of specific user parameters that are used during programming;

by means of the bidirectional data bus 29 to the interface block 25 for the transmission or reception of data based on a predetermined communication protocol, determined dynamically, based on the specific device 12 which is programmed;

by means of the data bus 33 to the auxiliary programmable unit 25, for transmitting the configuration parameters, dynamically chosen on the basis of the specific device 12 which is programmed, to the interface block 25.

The processing unit 20 is furthermore selectively connectable, by means of a serial line UART (Universal Asynchronous Receiver-Transmitter) 27 or a proprietary communication line 28 to an electronic processor 11, such as a personal computer, a laptop computer or other, provided with adequate user interface.

The second electronic memory 22 is a non-volatile type memory with high storage capacity and high read and write access speed. The preventive loading of the programming data in this memory allows not having to use, during the programming phase of the device 12, the communication lines 27 and 28 towards the electronic processor to have access to the programming data. This results in a decrease in the programming time of the device 12.

The third electronic memory 23 is a selectively removable electronic memory of the non-volatile type, such as an SD (Storage Device) or micro-SD memory inserted in a corresponding slot, not indicated, and is arranged for storing specific configuration parameters of the apparatus 10, specifically of the FPD programmable part of the unit 20. Therefore, the removal of the memory 23 and its reprogramming, or the replacement with a different memory 15 with other stored contents, makes it possible to modify, substantially at each power-on, the configuration parameters of the apparatus, based on the specific device 12 to be programmed.

The interface block 25 is arranged to define the correct levels of the electrical signals and the specific signal lines to be used for programming the specific device 12. The interface block 25 is, in fact, connected on one side to the processing unit 20 and on the other, by means of the communication line 26, to the device 12 to be programmed.

The communication line 26 comprises a predetermined set of electrical conductors, which can be in different numbers depending on the type of device 12 programmed from time to time. Advantageously, the communication line 26 is connected to an electrical and mechanical adapter, not shown, in turn physically connected to the electrical device 12 to be programmed, which allows to define the desired and specific electrical programming signals compatible with the device 12.

The interface block 25 comprises, in particular, a predetermined set of elements, not indicated, selectively and dynamically configurable, by the interface 29, by the processing unit 20, so as to establish with the device 12 a predetermined electrical connection in operation of the direction of the specific programming signals.

The interface block 25 also comprises a dynamically configurable system for selecting the input and output voltage level of the specific programming signals, not indicated, by the interface 29, by the processing unit 20, so as to establish with the device 12 a predetermined electrical connection depending on the voltage level of the specific programming signals.

The interface block 25 further comprises a system for defining the input and output behaviour of the specific programming signals, not indicated, selectively and dynamically configurable, by means of the interface 34, by the programmable unit 24, so as to be established with the device 12 is a predetermined electrical connection depending on the configuration of the pull-up or pull-down condition of the specific programming signals.

The processing unit 20 is programmed, as will be described below, so as to define different functional blocks, as described below:
- a first block 101 manages the communication of the data through the UART serial line 27;
- a second block 102 manages the data communication through the proprietary communication line 28;
- a third block 103 manages the communication between the HPS processor part of the processing unit and the FPD programmable part of the processing unit;
- a fourth block 104 emulates the operation of a predetermined microprocessor, dynamically selected on the basis of the electronic device 12 which is programmed; the fourth block 104 processes and manages the specific programming algorithm and sends the programming data towards the interface block 25 and, therefore, in turn, towards the device 12; the fourth block 104 is replicated by the number of programming channels supported by the programming system 10, that is by the number of devices that can be programmed in parallel;
- a fifth block 105 manages the data exchange with the electronic memory 23 through the line 32;
- a sixth block 106 manages the data exchange with the electronic memory 21 through the data bus 30;
- a seventh block 107 manages the data exchange with the electronic memory 22 through the data bus 31;
- an eighth block 108 manages the communication with the programmable unit 24 through the line 33 and, therefore in turn, towards the interface block 25 through the line 34;
- a ninth block 109 manages, through the HPS processor part of the processing unit 20, the dynamic loading of the configuration of the FPD programmable part of the processing unit 20.

The aforementioned functional blocks can be dynamically modified by reprogramming the programmable part of the processing unit 20, depending on the specific device 12 to be programmed. In particular, the block 104 can be frequently reprogrammed, through the block 109, according to the possible modifications of the hardware architectures.

Therefore, even in the event of any modifications and/or changes to specific devices to be programmed, it is not necessary to replace or redesign the apparatus 10 itself and therefore, also the entire relevant functional application code.

The operation of the apparatus 10 described up to this point is described below. When it is powered on, the apparatus 10, before it can be used for programming an electronic device 12, is initialized by means of a series of operations which allow its different components of the apparatus to be configured; a preferred initialization sequence is described below. It is understood that this sequence must not be understood as limiting since other sequences are possible depending on the presence of other and different components.

In the initialization phase, the HPS processor part of the processing unit 20 accesses the non-volatile memory 23 via the access line 32 to read the files relating to the operating system and activate the boot sequence. The operating system based on the HPS processor part of the processing unit 20 manages the functional blocks described above corresponding to the numbers 101, 102, 103, 105, 106, 107 and 109.

In the initialization stage, the electronic processor, via the interfaces 27 or 28, sends to the HPS processor part of the processing unit 20 the data and programming parameters relating to the device 12 which are in turn stored in the memory 23. The HPS processor part of the processing unit 20, through the functional block 109, accesses the non-volatile memory 23 and programs the FPD programmable part of the processing unit 20 based on the settings received from the user interface present on the electronic processor 11 via the interface 27 or 28. This last procedure allows the functional block 104 to be dynamically modified. The functional block 104 of the processing unit 20, in turn, configures the interface block 25, in particular performs the assignment of the signals, their directions (input/output) and their voltage level based on the received settings from the HPS processor part of the processing unit 20. The functional block 104 of the processing unit 20 also communicates to the programmable unit 24 the configuration of the signals when they are not driven (pull-up or pull-down condition) based on the settings received from the HPS processor part of the processing unit 20. The programmable unit 24 in turn configures the interface block 25.

During programming of the device 12, the HPS processor part of the processing unit 20 reads programming data blocks of the device 12 from the memory 23 using the memory 21 or the memory 22 as support. These data are sent to the FPD programmable part of the processing unit 20 which, in turn, sends them to the interface block 25 and, therefore, to the device 12 to be programmed. This programming step is carried out in a per se known way, and therefore not further described here.

Figure 2:
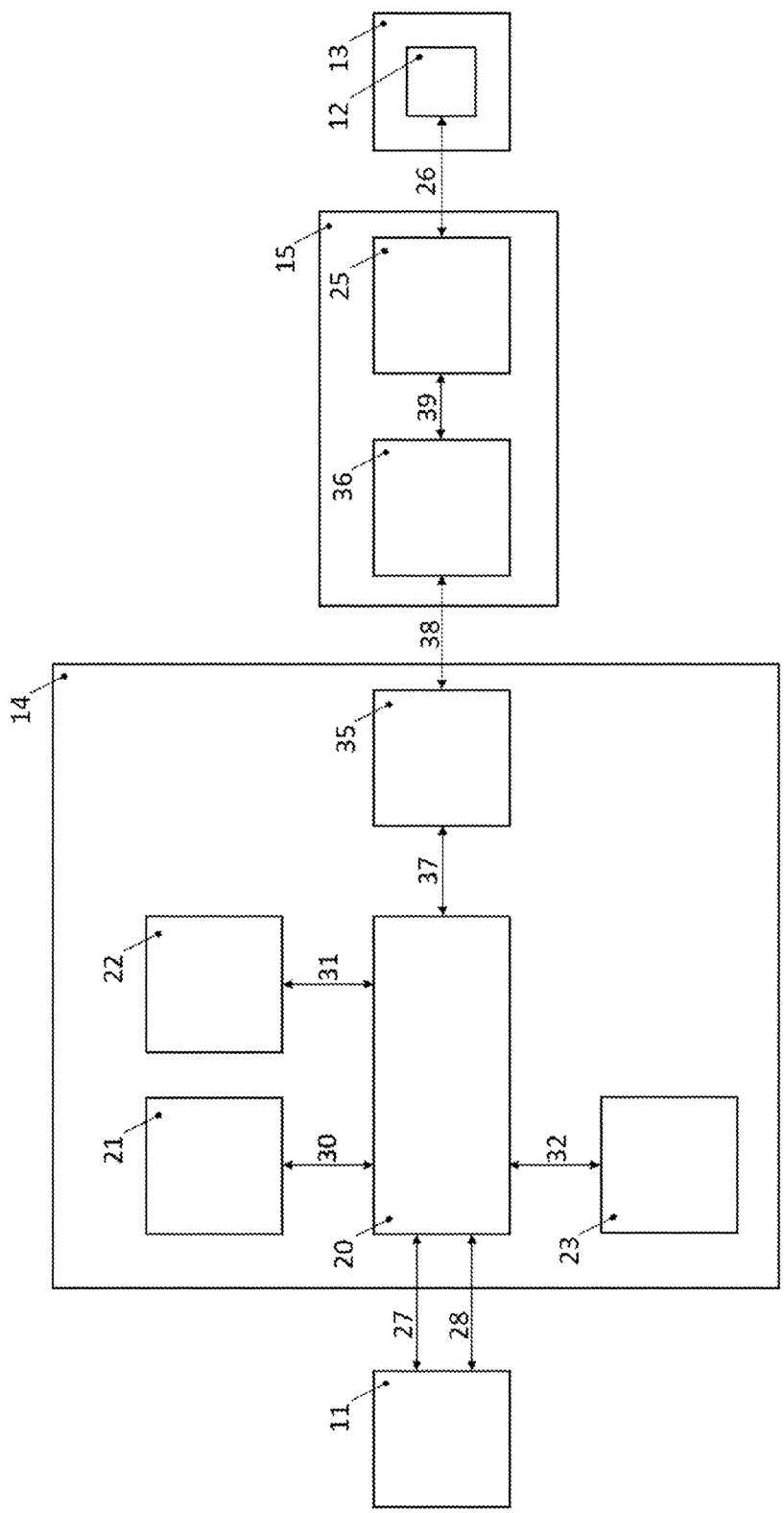
FIG. 2 is a block diagram schematically representing the implementation in which the device to be programmed is connected to the programming system via bidirectional differential parallel lines.

With reference to FIG. 2, an apparatus 14, which represents an evolution of the apparatus 10 defined above, is flanked by a secondary external unit 15 connected to the programming system 14 via a communication line 38.

The apparatus 14 comprises a processing unit 20, a first volatile electronic memory 21, a second non-volatile electronic memory 22, a third non-volatile electronic memory 23 and at least one communication block 35.

The secondary external unit 15 is composed of a communication block 36 and an interface block 25.

The communication block 35 of the apparatus 14 is connected:
- by means of the bidirectional data bus 37 to the processing unit 20 for the transmission or reception of data based on a predetermined communication protocol, determined dynamically, based on the specific device 12 which is programmed;
- by means of the bidirectional data bus 38 to the communication block 36 of the secondary external unit 15 for the transmission or reception of data based on a predetermined communication protocol, determined dynamically, based on the specific device 12 which is programmed.

The communication block 35 exchanges data with the processing unit 20 through the communication interface 37 which is constituted by a set of bidirectional single-ended lines. The communication block 35 carries out the conversion of the single-ended lines of the interface 37 into bidirectional differential lines of the communication line 38.

The communication line 38 is constituted, but not exclusively, by bidirectional data lines in differential format and by supply lines.

The communication block 36 of the secondary external unit 15 is connected:
- by means of the bidirectional data bus 38 to the communication block 35 of the programming system 14 for the transmission or reception of data based on a predetermined communication protocol, determined dynamically, based on the specific device 12 which is programmed;
- by means of the bidirectional data bus 39 to the interface block 25 of the secondary external unit 15 for the transmission or reception of data based on a predetermined communication protocol, determined dynamically, based on the specific device 12 which is programmed via the communication line 26.

The communication block 36 of the secondary external unit 15 exchanges data with the communication block 35 of the programming system 14 through the communication interface 38 which is constituted by a set of bidirectional data lines of differential type. The communication block 36 carries out the conversion of the differential lines of the interface 38 into bidirectional single-ended lines of the communication line 39.

The communication line 39 is constituted, but not exclusively, by bidirectional data lines in single-ended format and by supply lines.

Figure 3:
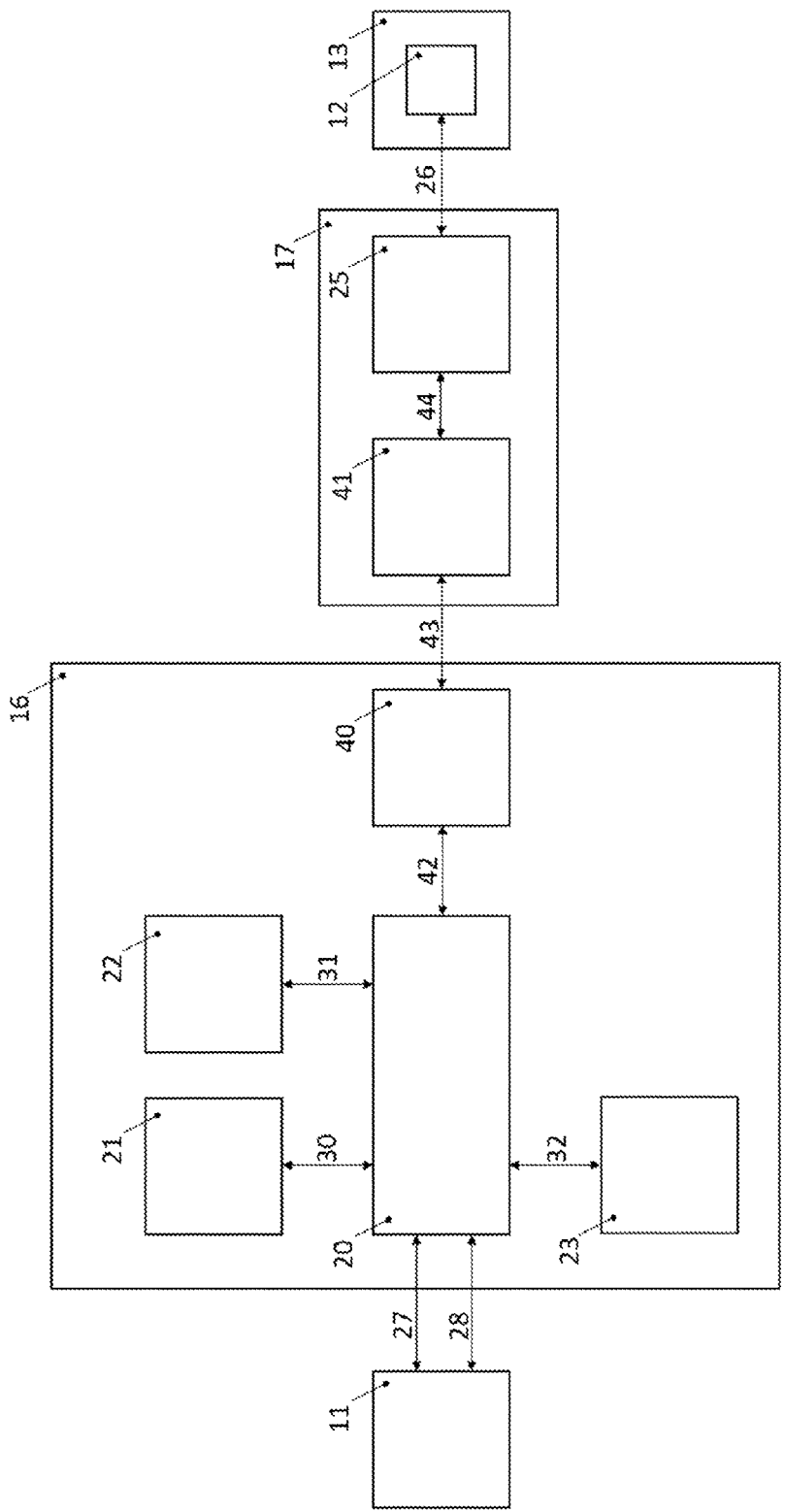
FIG. 3 is a block diagram schematically representing the implementation in which the device to be programmed is connected to the programming system via bidirectional differential high-speed serial lines.

With reference to FIG. 3, an apparatus 16, which represents an evolution of the apparatuses 10 e 14 defined above, is flanked by a secondary external unit 17 connected to the programming system 16 via a communication line 43.

The apparatus 16 comprises a processing unit 20, a first volatile electronic memory 21, a second non-volatile electronic memory 22, a third non-volatile electronic memory 23 and at least one communication block 40.

The secondary external unit 17 is composed of a communication block 41 and an interface block 25.

The communication block 41 of the apparatus 16 is connected:
- by means of the bidirectional data bus 42 to the processing unit 20 for the transmission or reception of data based on a predetermined communication protocol, determined dynamically, based on the specific device 12 which is programmed;
- by means of the bidirectional data bus 43 to the communication block 41 of the secondary external unit 17 for the transmission or reception of data based on a predetermined communication protocol, determined dynamically, based on the specific device 12 which is programmed.

The communication block 40 exchanges data with the processing unit 20 through the communication interface 42 which is constituted by a set of bidirectional single-ended lines. The communication block 40 carries out the conversion and serialization/de-serialization of the single-ended lines of the interface 42 in one or more high-speed bidirectional differential serial lines of the communication line 43.

The communication line 43 is constituted by one or more high-speed differential two-way serial data lines and supply lines. By way of non-limiting example, they can be used as a means of transmitting ethernet cables by exploiting the differential lines for the passage of high-speed data and the technique of Power On Ethernet (POE) for power transport.

The communication block 41 of the secondary external unit 17 is connected:
- by means of the bidirectional data bus 43 to the communication block 40 of the programming system 16 for the transmission or reception of data based on a predetermined communication protocol, determined dynamically, based on the specific device 12 which is programmed;
- by means of the bidirectional data bus 44 to the interface block 25 of the secondary external unit 17 for the transmission or reception of data based on a predetermined communication protocol, determined dynamically, based on the specific device 12 which is programmed via the communication line 26.

The communication block 41 of the secondary external unit 17 exchanges data with the communication block 40 of the programming system 16 through the communication interface 43 which is constituted by one or more high-speed differential serial lines. The communication block carries out the conversion and serialization/de-serialization of the high-speed differential serial lines of the interface 43 into single-ended bidirectional lines of the communication line 44.

The communication line 44 is constituted, but not exclusively, by bidirectional data lines in single-ended format and by supply lines.

By way of non-limiting example, the communication blocks 40 and 41, present respectively in the programming system 16 and in the secondary external unit 17, can be realized using programmable FPGA devices which integrate the serialization and de-serialization systems of the high speed SERDES Transceiver type.

Figure 4:
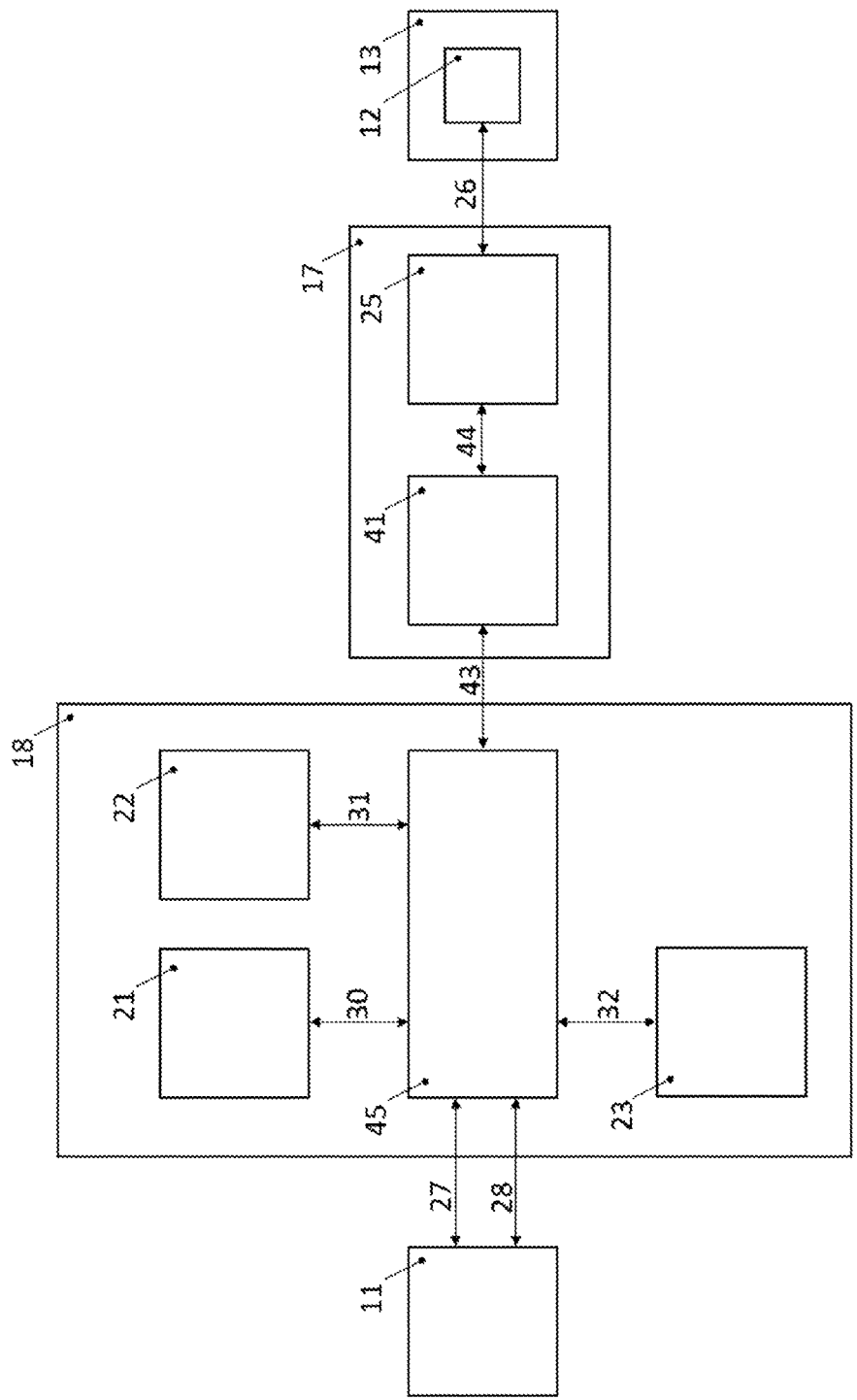
FIG. 4 is a block diagram schematically representing the implementation in which the device to be programmed is connected to the programming system by means of bidirectional differential high-speed serial lines; in the latter implementation, the high-speed serialization/de-serialization procedure is integrated into the programming system's processing unit.

With reference to FIG. 4, an apparatus 18, which represents an evolution of the apparatus 16 defined above, is flanked by a secondary external unit 17 connected to the programming system 18 via a communication line 43.

The variation introduced in the programming system 18, with respect to the previous programming system 16, concerns the elimination of the communication block 40 and of the interface 42 and the replacement of the processing unit 20 with the processing unit 45. The functions performed by the communication block 40 and the interface 42 are integrated in the processing unit 45.

By way of example but not limited thereto, there is finally the possibility of using a processing unit, in a single electronic component, composed of a microprocessor unit or a Hard Processor System (HPS) unit, a programmable unit or FPD unit (FPGA) and one or more high speed SERDES Transceivers. This allows to limit the necessary space on the printed circuit and to have very fast and efficient communication channels between the component units.

The invention claimed is:

1. Apparatus for programming an electronic device, in particular for In System Programming (ISP), In Circuit Programming (ICP) or Pre Programming (PP), comprising electronic processing means suitable for processing and managing at least a programming algorithm of said electronic device; programming means connected to said processing means and to said electronic device for receiving from said processing means the programming data and for sending them to said electronic device through a predetermined communication protocol; interface means associated with said processing means and with said electronic device; and non-volatile electronic storage means adapted to exchange data with said electronic processing means by means of at least one bidirectional data communication line; wherein it further comprises a secondary external unit connected to a communication block and to said electronic device via respective data communication lines; said secondary external unit comprising a communication block and an interface block connected together by bidirectional data lines.

2. Apparatus according to claim 1, wherein said non-volatile electronic storage means comprise interchangeable means and fixed means.

3. Apparatus according to claim 1, wherein it further comprises fixed electronic means for volatile storage adapted to exchanging data with said electronic processing means through a bidirectional data communication line.

4. Apparatus according to claim 1, wherein said electronic processing means are connected by a unidirectional data communication line to an auxiliary programmable unit connected to said interface means.

5. Apparatus according claim 1, wherein at least one of said data communication lines between said secondary external unit connected to a communication block through at least one pair data lines in differential high-speed parallel format and at least one power line; said secondary external unit comprising a communication block and an interface block connected to each other by bidirectional data lines.

6. Apparatus according claim 1, wherein at least one of said data communication lines between said secondary external unit connected to a communication block through at least one pair of data lines in differential high-speed serial format and at least one power line; said secondary external unit comprising a communication block and an interface block connected to each other by bidirectional data lines.

7. Apparatus according claim 1, wherein it further comprises a secondary external unit connected to a processing block through at least one pair of data lines in differential high-speed serial format and at least one power line; said secondary external unit comprising a communication block and an interface block connected to each other by bidirectional data lines.

* * * * *